United States Patent
Shim et al.

(10) Patent No.: US 7,018,892 B2
(45) Date of Patent: Mar. 28, 2006

(54) SEMICONDUCTOR CAPACITOR STRUCTURE AND METHOD FOR MANUFACTURING THE SAME

(75) Inventors: Woo-Gwan Shim, Gyeonggi-do (KR); Chang-Ki Hong, Gyeonggi-do (KR); Sang-Jun Choi, Seoul (KR); Jeong-Nam Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 10/835,142

(22) Filed: Apr. 28, 2004

(65) Prior Publication Data

US 2005/0037562 A1   Feb. 17, 2005

(30) Foreign Application Priority Data

Aug. 13, 2003   (KR) .................. 10-2003-0056009

(51) Int. Cl.
 *H01L 21/8242* (2006.01)
(52) U.S. Cl. ....................... 438/254; 438/978
(58) Field of Classification Search .............. None
See application file for complete search history.

(56) References Cited

U.S. PATENT DOCUMENTS

| | | | |
|---|---|---|---|
| 4,715,930 A * | 12/1987 | Diem | 438/978 |
| 5,393,688 A | 2/1995 | Motonami et al. | |
| 5,843,822 A * | 12/1998 | Hsia et al. | 438/254 |
| 5,861,331 A | 1/1999 | Chien | |
| 5,903,024 A | 5/1999 | Hsu | |
| 6,387,752 B1 | 5/2002 | Sakao | |
| 6,459,112 B1 | 10/2002 | Tsuboi et al. | |
| 6,544,345 B1 | 4/2003 | Mayer et al. | |
| 6,548,853 B1 | 4/2003 | Hwang et al. | |
| 2003/0017677 A1 | 1/2003 | Yu et al. | |

FOREIGN PATENT DOCUMENTS

| | | |
|---|---|---|
| JP | 10-289981 | 10/1998 |
| KR | 1996-0043175 | 12/1996 |
| KR | 1998-031090 | 7/1998 |
| KR | 1999-075646 | 10/1999 |
| KR | 2001-65795 | 11/2001 |
| KR | 2002-0091642 | 12/2002 |
| KR | 2003-0002849 | 1/2003 |

OTHER PUBLICATIONS

English language Abstract from Korean Patent Publication No. 2003-0002849.

(Continued)

*Primary Examiner*—Chandra Chaudhari
(74) *Attorney, Agent, or Firm*—Marger Johnson & McCollom, P.C.

(57) ABSTRACT

In one embodiment, a semiconductor device comprises a base and a tapered wall formed on the base. The wall has a midline and also has an inner sidewall and an outer sidewall. The inner sidewall and the outer sidewall are substantially symmetrical with each other in relation to the midline. Thus, the reliability of the semiconductor capacitor structure can be improved and the throughput can be increased. Also, further scaling down of semiconductor devices can be facilitated with the principles of the present invention.

30 Claims, 9 Drawing Sheets

OTHER PUBLICATIONS

English language Abstract from Korean Patent Publication No. 2001-65795.

English language Abstract from Korean Patent Publication No. 1999-075646.

English language Abstract from Korean Patent Publication No. 1996-0043175.

English language Abstract from Korean Patent Publication No. 1998-031090.

English language Abstract from Korean Patent Publication No. 2002-0091642.

English language Abstract from Japanese Patent Publication No. 10-289981.

* cited by examiner

SEMICONDUCTOR CAPACITOR STRUCTURE AND METHOD FOR MANUFACTURING THE SAME

BACKGROUND OF THE INVENTION

This application claims the priority of Korean Patent Application No. 2003-0056009, filed on Aug. 13, 2003, in the Korean Intellectual Property Office, the contents of which are incorporated herein in their entirety by reference.

1. Field of the Invention

The present invention relates to semiconductor devices and, more particularly, to semiconductor capacitor structures and methods for manufacturing the same.

2. Description of the Related Art

The driving capability of semiconductor devices such as dynamic random access memory (DRAM) is determined by the capacitance of capacitors, which generally consist of a capacitor dielectric layer sandwiched between two capacitor electrodes. The capacitance is largely determined by the total surface area of the electrodes and the distance between the electrodes as determined by the thickness of the capacitor dielectric layer. Therefore, many attempts have been made to increase the capacitance by increasing the effective surface area of the capacitor electrodes.

Unfortunately, however, as semiconductor devices become more highly integrated, the area allocated for forming capacitors within the devices typically becomes reduced. In other words, as integration density increases, the width of capacitors narrows, and it becomes more difficult to obtain the desired capacitance levels.

Fabrication technologies have been developed to increase the height of a capacitor electrode or storage node, to increase the effective surface area thereof and to retain a desirable cell capacitance of the unit cell. For example, a storage node can be formed in a concave or cylindrical shape having a height of more than 1 μm.

Figure 1A:
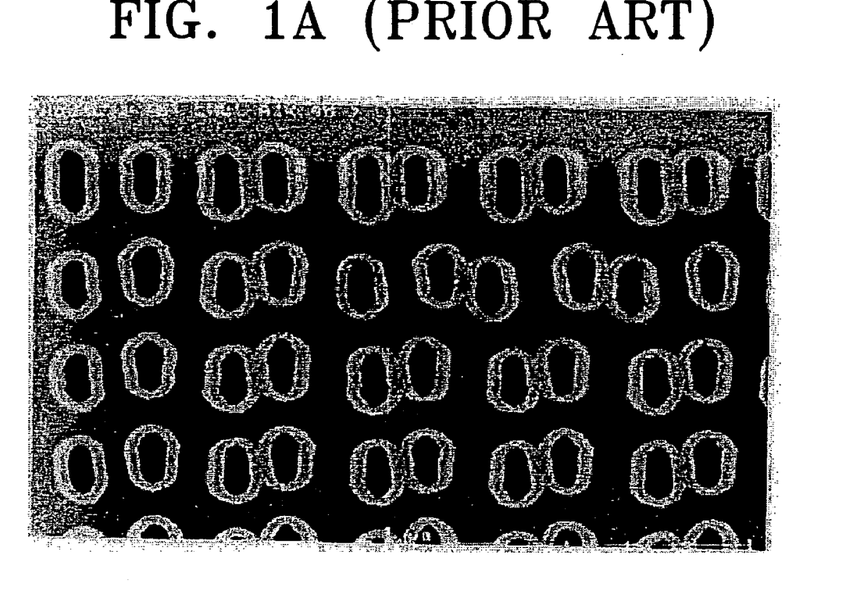
FIGS. 1A–1B are a plan and a perspective view, respectively, of a capacitor lower electrode illustrating conventional problems of stiction and leaning of storage nodes.
Figure 1B:
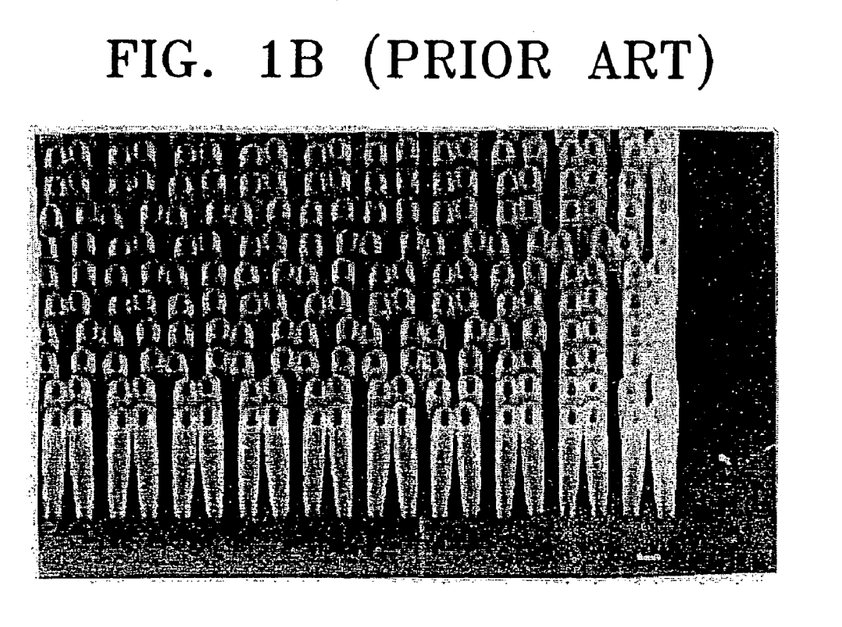

Unfortunately, as the height of the storage node increases, the area of the storage node decreases due to the increasingly sloped profile of the storage node formation hole. This leads to an increasingly unstable and unreliable capacitor structure. In particular, a phenomenon such as "stiction" or "leaning" of storage nodes can occur, especially if the height of the storage nodes is above 15,000 nm. These problems are illustrated, for example, FIGS. 1A and 1B. The stiction phenomenon is typically caused by the surface tension of a liquid drop remaining between the ends of adjacent storage node electrodes during a drying process performed before a cleaning process. The leaning phenomenon is caused by a difference in the coefficients of thermal expansion (CTE) between an etch stop nitride layer and storage nodes during thermal cycling.

To improve the stability of the capacitor structures, the width of the bottom portion of the storage node should be increased and a sufficient distance between the adjacent storage nodes need to be ensured. In this respect, a minimum space critical dimension (CD) has been defined to represent a desired distance between adjacent storage nodes in a diagonal direction. Increasing this minimum space CD reduces the likelihood that the storage nodes will not fall in the event that there is leaning of storage nodes.

Figure 2A:
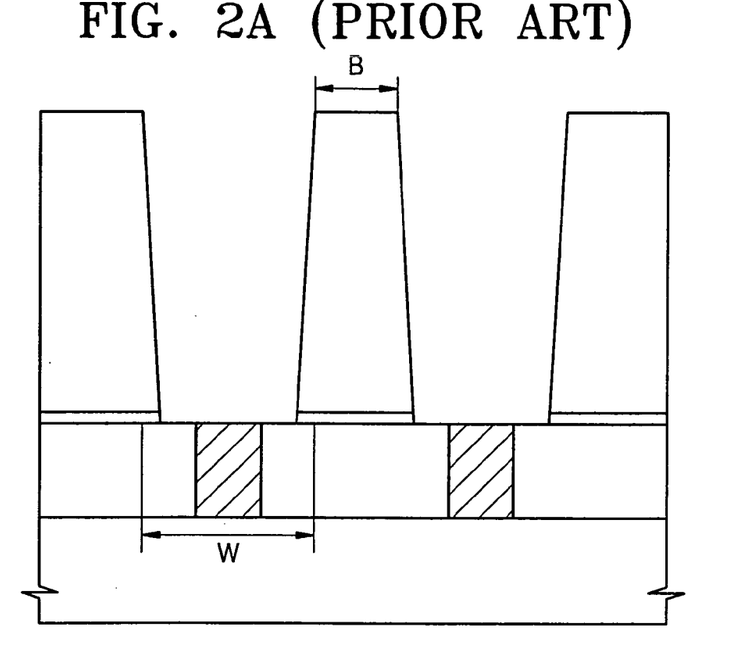
FIG. 2 is a cross-sectional view of a structure to form a conventional semiconductor device illustrating the problems of the prior art.
Figure 2B:
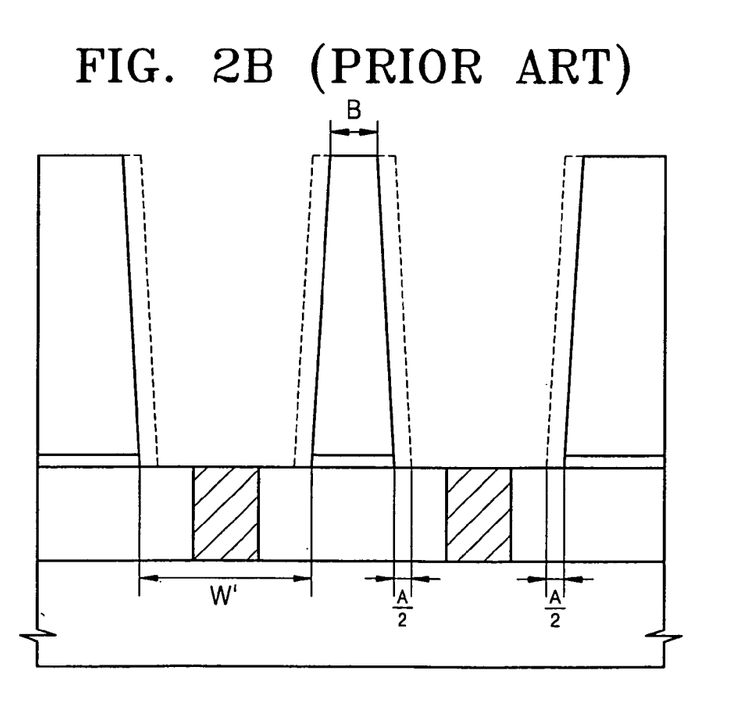

However, as illustrated in FIGS. 2A–2B, obtaining the sufficient distance between the storage nodes has become more difficult as the device sizes become scaled down. In particular, it is difficult to increase the width W of the bottom portion of the storage nodes without decreasing the distance B between the adjacent storage nodes. In particular, as the width W of the storage node bottom portion increases to W' by an amount A (See FIG. 2B), the distance B between the storage nodes inevitably decreases to B' by a proportionate amount.

It is, therefore, difficult to form a reliable capacitor structure without decreasing the storage node bottom portion while avoiding conventional problems such as stiction or leaning of storage nodes.

SUMMARY OF THE INVENTION

In one embodiment of the present invention, a semiconductor capacitor lower electrode comprises a base; and a tapered wall formed on the base. The wall has a midline. The wall has an inner sidewall and an outer sidewall. The inner sidewall and the outer sidewall are substantially symmetrical with each other in relation to the midline.

In one aspect, the wall is stepwise tapered. In another aspect, the wall is tapered gradually without a step.

In accordance with another embodiment of the present invention, a method for forming a semiconductor device comprises: forming an interlayer insulating layer on a semiconductor substrate, the interlayer insulating layer having a conductive pad therein; forming an etch stop layer on the interlayer insulating layer; forming a first sacrificial layer on the etch stop layer; forming a first storage node opening in the first sacrificial layer; depositing a conductive layer on the first sacrificial layer and on the sidewalls and the bottom of the opening; forming a second sacrificial layer on the conductive layer; planarizing the resulting structure until the top surface of the first sacrificial layer is exposed; partially removing an upper portion of the first and second sacrificial layers to expose a sidewall portion of the conductive layer; thinning the exposed sidewall portion; and removing the remaining portion of the first and second sacrificial layers.

Thus, the reliability of the semiconductor capacitor structure can be improved and the throughput can be increased. Also, further scaling down of semiconductor devices can be facilitated with the principles of the present invention.

BRIEF DESCRIPTION OF THE DRAWINGS

The above and additional objects and advantages of the present invention will become more readily apparent through the following detailed description of preferred embodiments, made with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element.

Figure 3:
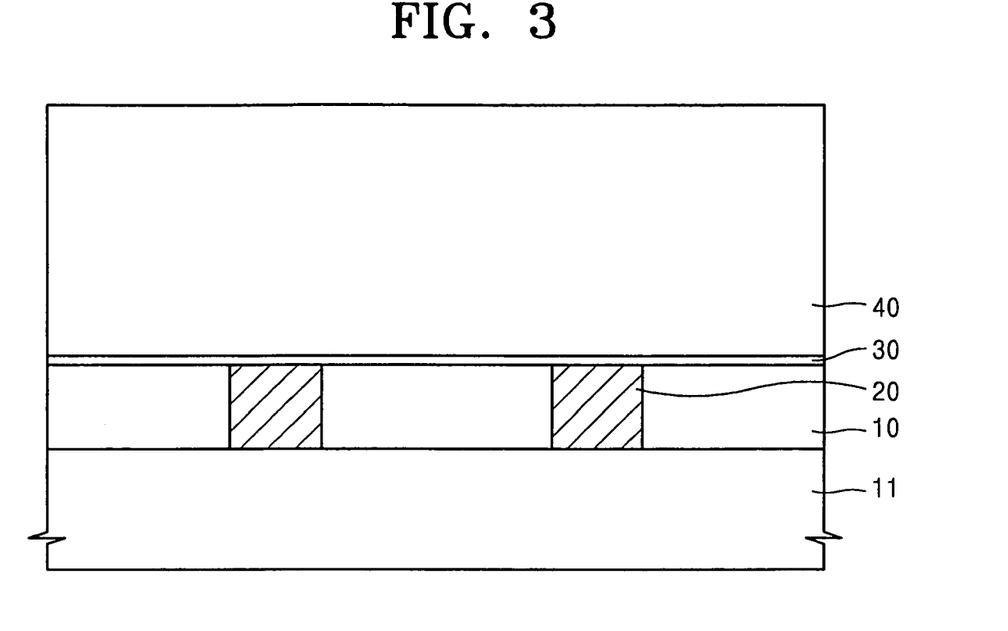
FIGS. 3 through 14 are cross-sectional views illustrating a method of manufacturing a capacitor according to an embodiment of the embodiment of the present invention.

Referring to FIG. 3, to form a semiconductor device having a storage node according to one embodiment of the present invention, a first insulating layer 10 having a contact plug 20 formed therein is formed on a semiconductor substrate 11. The first insulating layer 10 can be formed of a dielectric material such as oxide. The substrate 11 may be a semiconductor wafer such as a silicon wafer or a predetermined material layer formed thereon. Although not shown, a lower structure that may include source/drain regions and gate electrodes can be formed on the semiconductor substrate 11 to form a transistor or a memory cell. The contact plug 20 is electrically connected to a storage node be formed thereon, for example, using conventional techniques. The contact plug 20 is also electrically connected to active regions of the semiconductor substrate 11. Although not shown, the contact plug 20 may be connected to the active regions via a contact pad, as is known to one skilled in the art. The first insulating layer 10 may be planarized.

Next, an etch stop layer 30 and a second insulating layer 40 are sequentially formed on the first insulating layer pattern 10, such as is known in the art. The etch stop layer 30 may, for example, be formed of a material such as silicon nitride having an etch selectivity with respect to the second insulating layer 40 to serve as an end point during a subsequent etching lift-off process to remove the second insulating layer 40. The second insulating layer 40 may be formed of oxide having a thickness between about 3,000 to 20,000 angstroms using a low-pressure chemical vapor deposition (LPCVD) process, for example. The second insulating layer 40 can be a single layer of plasma-enhanced tetraethylorthosilicate (PE-TEOS) or a multilayer including the PE-TEOS layer.

Figure 4:
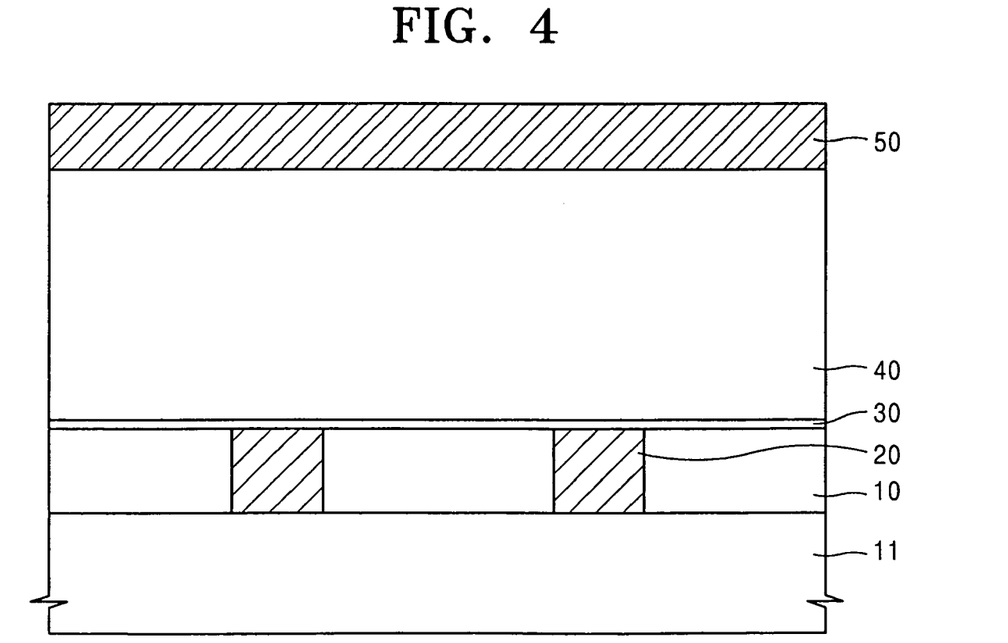

Referring to FIG. 4, a photoresist 50 is then preferably formed on the second insulating layer 40.

Figure 5:
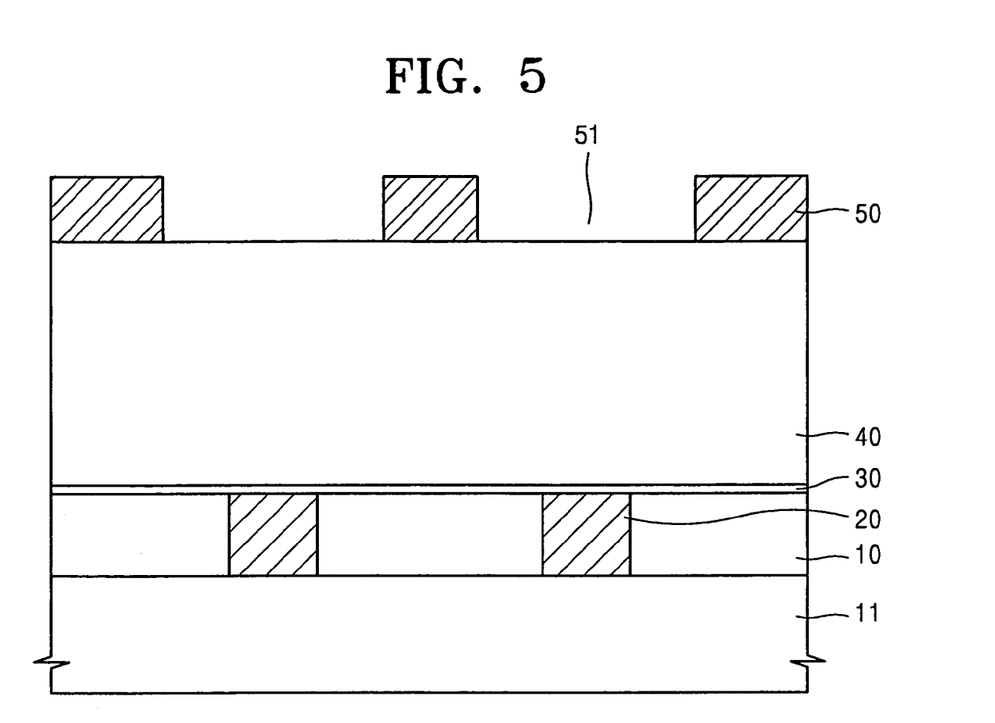

Referring to FIG. 5, the photoresist 50 can be patterned to form a photoresist pattern 50' having an opening 51 overlying the contact plug 20.

Figure 6:
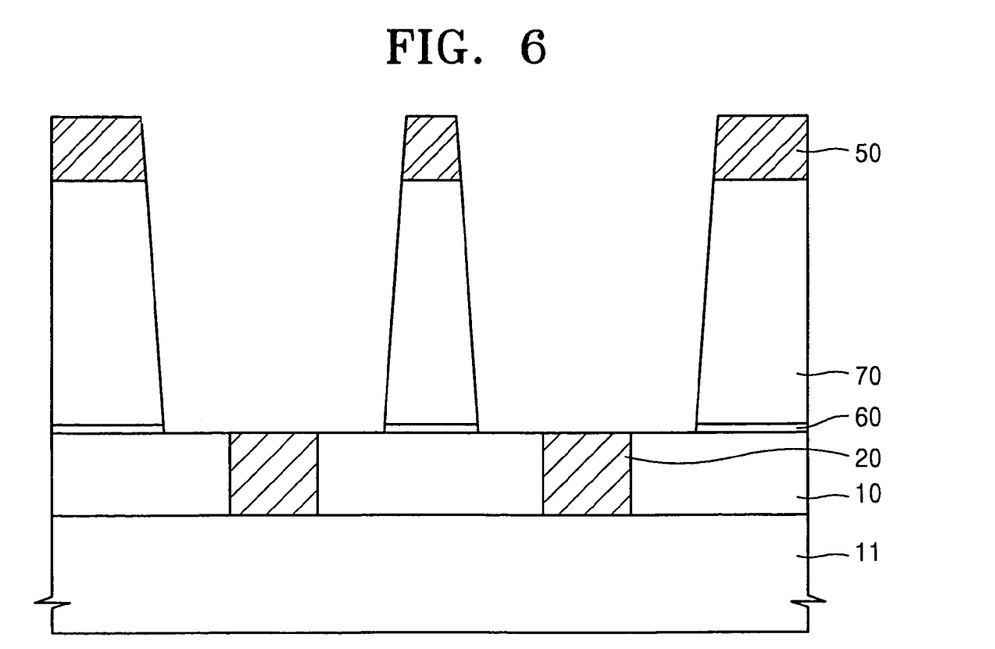

Referring to FIG. 6, the second insulating layer 40 and the etch stop layer 30 are subsequently etched using the photoresist pattern 50' as an etching mask, thereby forming a second insulating layer pattern 70 and an etch stop layer pattern 60, through which a storage node contact hole 80 extends.

Figure 7:
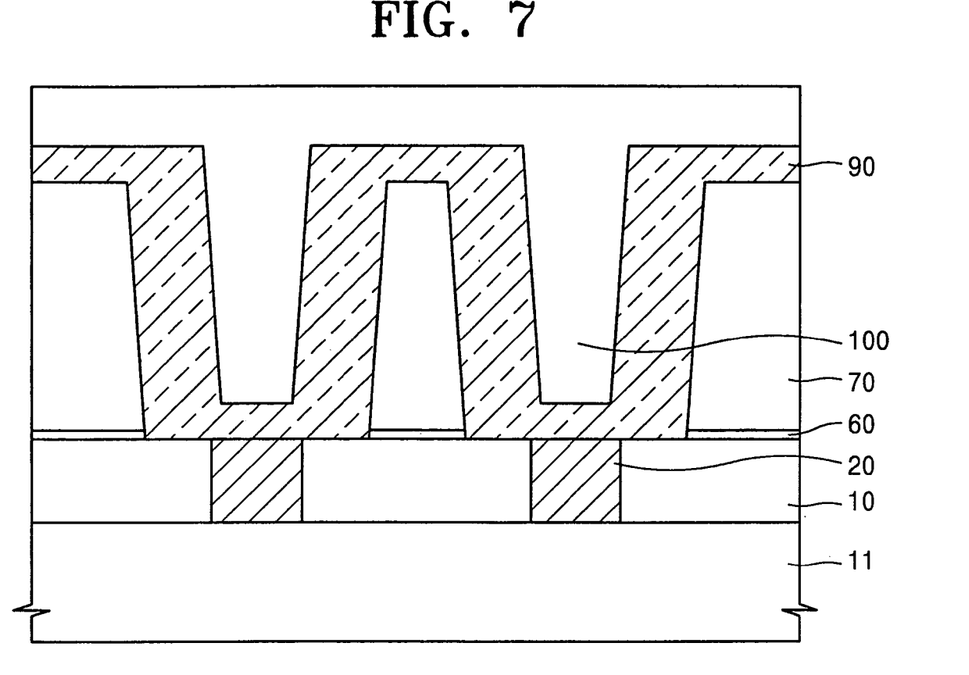

Turning to FIG. 7, the photoresist pattern 50' is then removed and a conductive layer 90 is conformally deposited over the second insulating layer pattern 70, but does not completely fill the storage node hole 80. Typically, in the prior art, the conductive layer 90 is formed to a thickness of about 400 angstroms. However, according to one embodiment of the present invention, the thickness of the conductive layer 90 may be about 600 angstroms. Thus, the width of the storage node bottom portion can be increased, thereby improving the stability of the capacitor structure, as will explained further below. The conductive layer 90 is preferably formed of a material such as a doped polysilicon, a metal such as W, Pt, Ru, and Ir, a conductive metal nitride such as TiN, TaN, and WN, and a conductive metal oxide such as $RuO_2$ and $IrO_2$, and any combination thereof. Then, a third insulating layer or a sacrificial layer 100 is preferably formed to a thickness such that the second insulating layer pattern 70 is completely covered.

Figure 8:
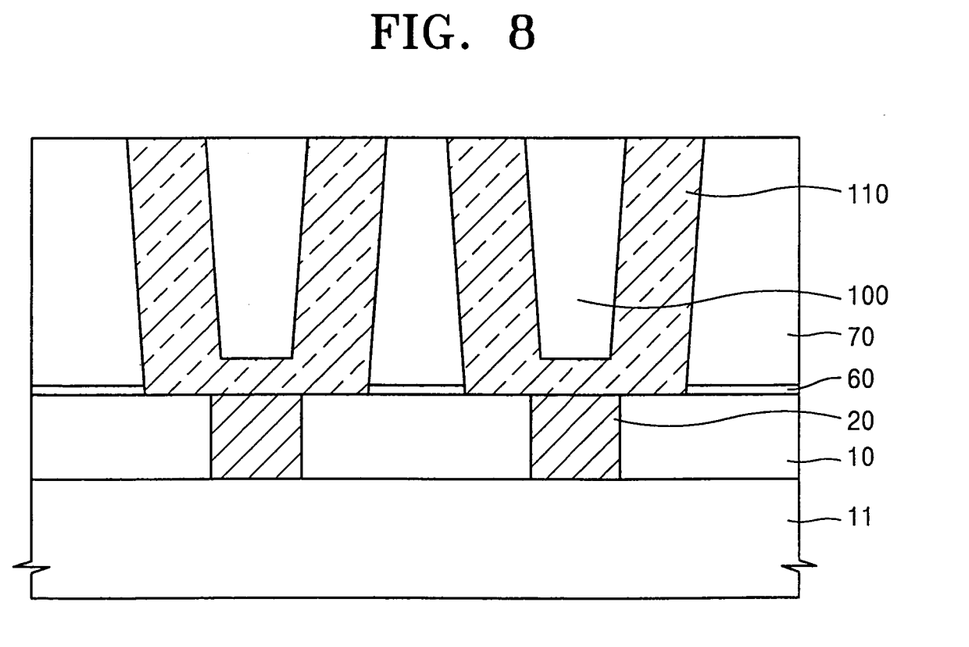

Referring to FIG. 8, the resulting structure is preferably planarized to form separated storage nodes 110 using conventional planarization techniques such as chemical mechanical polishing (CMP). During the planarization process, the top of the conductive layer 90 and the second and third insulating layers 70, 100 are planarized to form separated storage nodes 110.

Figure 9:
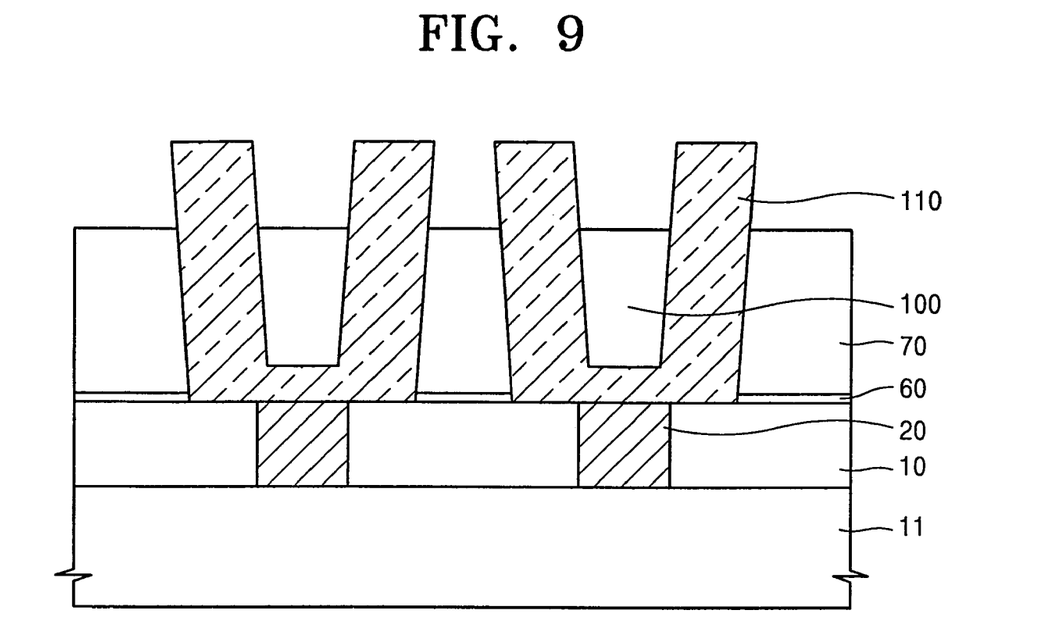

Referring to FIG. 9, the planarized second and third insulating layers 70, 100 are partially removed in a vertical direction. Preferably, an etch selectivity ratio for the second and third insulating layers 70, 100 and the storage nodes 110 is approximately 1000:1. Thus, during this process, the storage nodes 110 are preferably substantially left unetched.

In particular, the planarized second and third insulating layers 70, 100 can be partially removed through a chemical dry etching process. The chemical dry etching process preferably uses a gas phase without a plasma for etching. For example, a vaporized wet etchant such as anhydrous HF vapor plus $H_2O$ (gas) can be used. Because the chemical dry etching process can be performed without using a plasma, etching damage to the substrate surface can be reduced. Isoprophyl Alcohol (IPA), an alcohol group having $CH_3OH$, or carboxylic acid having $CH_3COOH$ can be used as a catalyst. The temperature of the substrate 11 may be approximately 0~60° C. Further, the flow rate of anhydrous HF may be approximately 100~2000 sccm/sec. Also, the flow rate of IPA may be approximately 50~200 sccm/sec.

Alternatively, the planarized second and third insulating layers 70, 100 can be etched or removed through a wet etching process using BOE (Buffered Oxide Etchant, i.e., HF+$NH_4F$). This is possible due to more stable storage node structure constructed according to the principles of the present invention.

Figure 10:
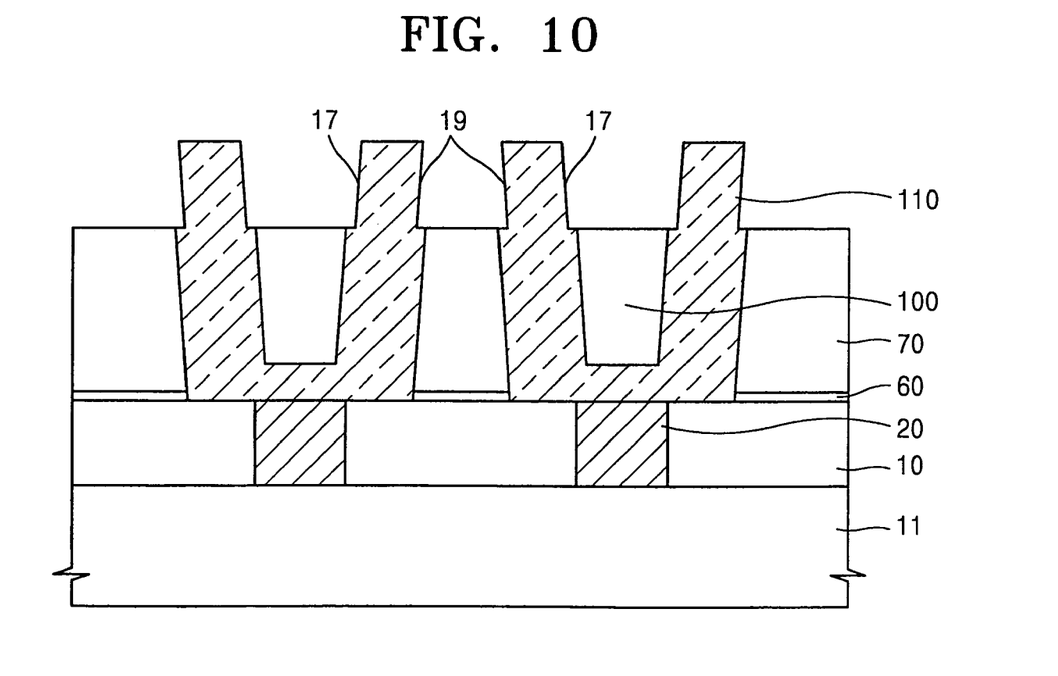

Referring to FIG. 10, thinning of the exposed sidewall portion of the storage node 110 is illustrated. In other words, inner and outer sidewalls 17, 19 of partially exposed storage node 110 are then preferably partially etched in a horizontal direction. For example, the inner and outer sidewalls 17, 19 of the partially exposed storage node 110 are both etched to a width of, for example, approximately 40 angstroms. An etch selectivity ratio for the storage nodes 110 and the second insulating layer pattern 70 (or the third insulating layer 100) is preferably greater than or equal to approximately 10:1. As in the vertical etching described above, the side walls of the partially exposed storage nodes 110 can be partially etched through a chemical dry etching process. The chemical dry etching process may use a gas phase etchant such as $CF_4+O_2$. The temperature of the substrate 11 may be approximately 0~60° C. The power may be approximately 100 W~600 W. The pressure may be approximately 10~50 Pa. The flow rate of $CF_4$ may be approximately 30~80 sccm/sec. The flow rate of $O_2$ may be approximately 150~300 sccm/sec.

Alternatively, the side walls 17, 19 of partially exposed storage node 110 may be partially etched in a horizontal direction through a wet etching process using SC1.

Either the chemical dry etching or wet etching can be used in either or both of the vertical or horizontal etching process. If the same etching method is used to perform both the vertical or horizontal etching process, the vertical and horizontal etching processes can be performed in situ.

One skilled in the art, however, will appreciate that the present invention is not limited to above process conditions, and that the above process conditions represent one of many possible sets of process conditions that can be used to form the stable capacitor structure of the present invention.

Figure 11:
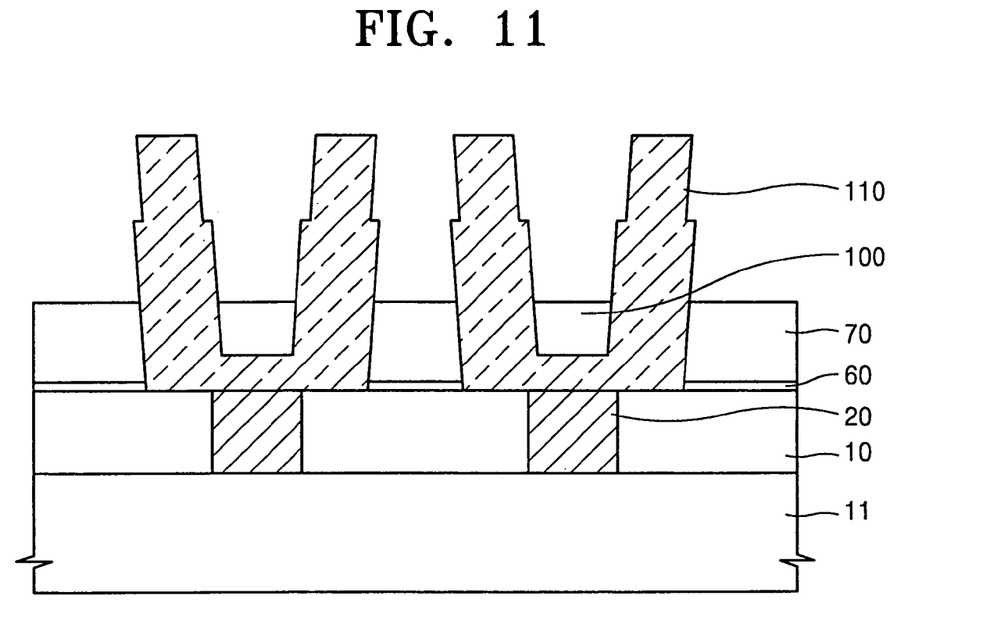

Referring to FIG. 11, the second insulating layer pattern 70 and the third insulating layer 100 are partially further removed again in a vertical direction without substantially etching the storage node 110 using a method similar to that described in connection with FIG. 9.

Figure 12:
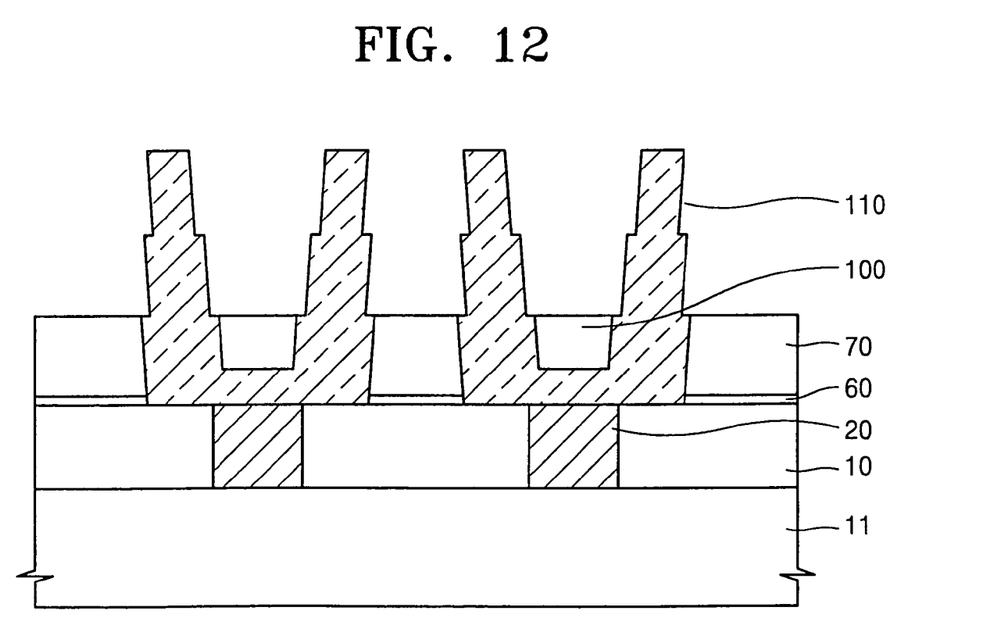

Referring to FIG. 12, the inner and outer side walls of the partially exposed storage nodes 110 are partially etched further again in a horizontal direction using a method similar to that described with reference to FIG. 10.

The number of the above horizontal and vertical etching steps can be determined depending on the particular application. For example, more horizontal and vertical etchings can be added or even reduced. In this embodiment, the number of steps formed on sidewalls of the storage nodes 110 is determined by the number of the horizontal and vertical etching steps.

Figure 13:
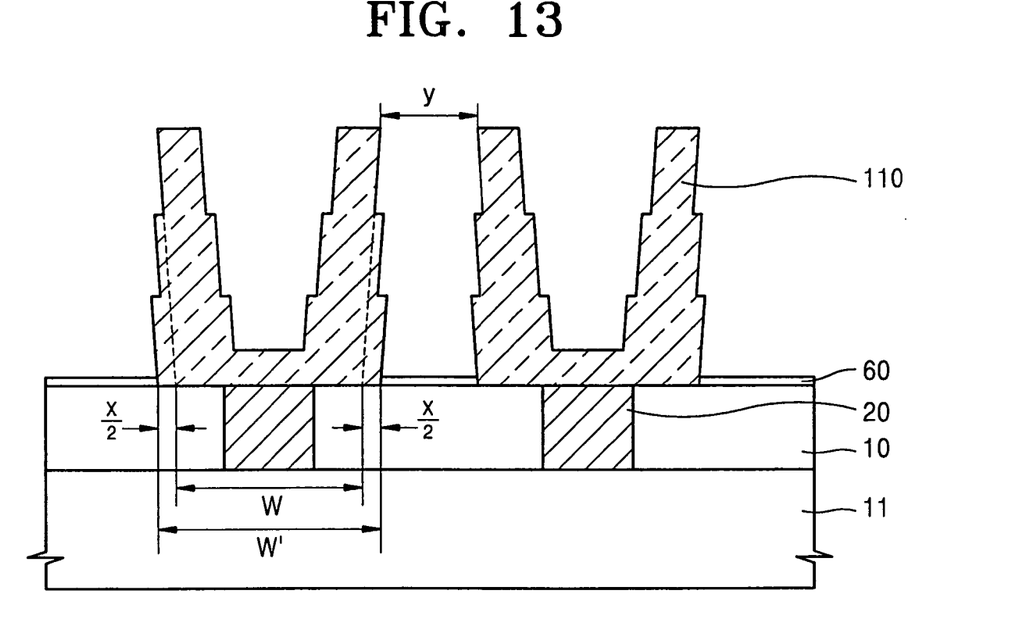

Referring to FIG. 13, the remaining second insulating layer pattern 70 and the third insulating layer 100 are substantially completely removed using an etchant such as BOE.

After removing the insulating layers 70, 100, a phosphine annealing process may be performed to improve the surface characteristics of the storage node 110.

Thus, according to the foregoing embodiment of the present invention, the width of the bottom portion of the storage node 110 can be increased by an amount "x", as indicated in FIG. 13, compared to the prior art capacitor structure represented by the dotted lines. The amount x is preferably in the range of 10 nm to 40 nm. The width of the bottom portion of the conventional storage node is represented by the letter W, while W' indicates the width of the bottom portion of the storage node 110 according to the above-described embodiment of the present invention. Preferably, the width W is about 3,200 angstroms and the width W' is about 4,000 angstroms. Also, the angle between the outer sidewalls 19 and the top surface of the storage node 110 may be closer to 90°, for example, 90±2° than that of the prior art structure. Thus, the distance "y" between the adjacent storage nodes 110 and the width of the bottom portion of the storage node can be substantially increased, as compared with the prior art capacitor structure. For this reason, the stability of the capacitor structure can be substantially increased, thereby decreasing the conventional problems such as stiction or leaning of storage nodes 110.

Figure 14:
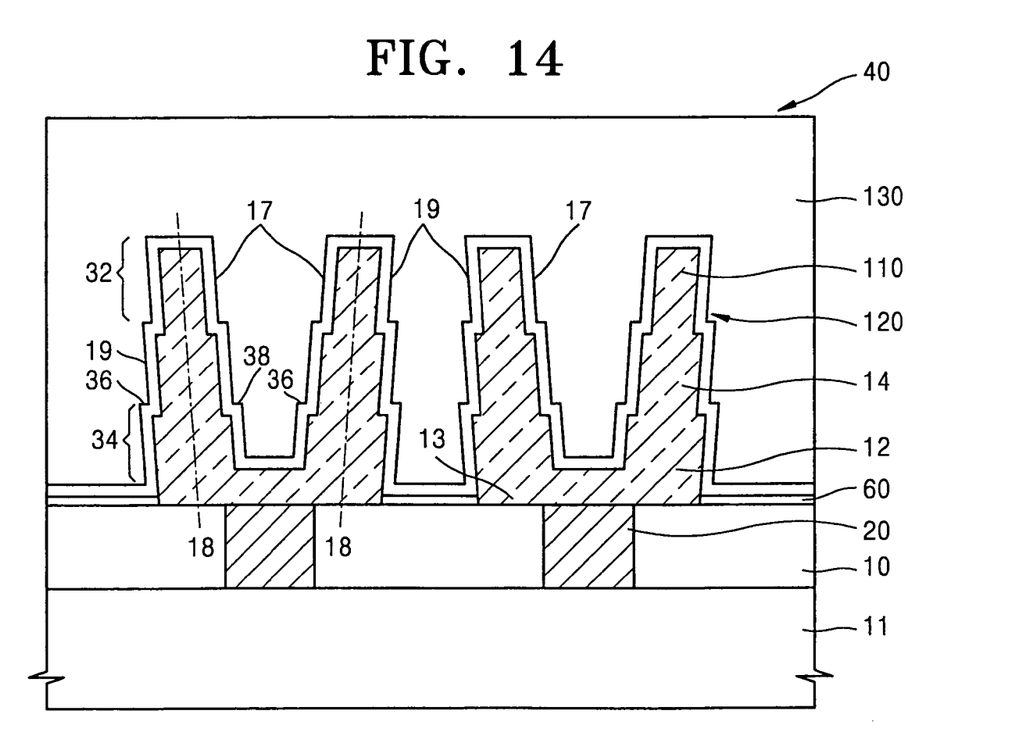

Referring to FIG. 14, a capacitor dielectric layer 120, formed, for example, of a conventional capacitor dielectric, is formed on the storage node (capacitor lower electrode) 110. Then, a capacitor upper electrode 130 is formed on the capacitor dielectric layer 120 to complete a capacitor 40. As in the lower electrode 110, the upper electrode 130 may be formed of a material selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and any combination thereof. However, the upper electrode 14 and the capacitor lower electrode 12 may be formed of different materials.

Accordingly, the capacitor 40 fabricated by the processes described above comprises a storage node 110 having a base 12 (or a bottom portion). The capacitor 40 further includes a tapered wall 14 formed on the base 12.

According to one aspect of the present invention, the wall 14 preferably has an upper portion 32 and a lower portion 34. The width of the upper portion 32 is at least 200 angstroms and the width of the lower portion is at least 400 angstroms. Thus, the lower portion 34 preferably has a greater width than the upper portion 32. The lower portion may be a portion of the wall 14 immediately below the upper portion 32 or the upper portion may be a portion of the wall 14 immediately above the lower portion 34.

Although it is not illustrated in the drawings, corners of the top end portion of the storage node 110 are preferably rounded off to prevent a device failure.

In one aspect, the wall 14 can be viewed as having an inner sidewall 17 and an outer sidewall 19. The wall 14 may be seen to have a midline 18, which is a center line connecting the mid points between the upper and the inner sidewalls 17, 19. The midline 18 is a virtual line drawn to illustrate concepts of the present invention. The inner sidewall 17 and the outer sidewall 19 are preferably substantially symmetrical with each other in relation to the midline 18.

In yet another aspect, the wall 14 may be stepwise tapered. In particular, the wall 14 has a first step 38 formed on the inner sidewall 17 and a second step 36 formed on the outer sidewall 19. The first and second steps 36, 38 may be substantially symmetrical in relation to the midline 18.

According to still another aspect of the present invention, the outer sidewall 19 of the wall 14 forms an approximately 90 degree angle with respect to the plane 13 of the base 12 or the top surface of the storage node 110, thus increasing the distance between the storage nodes 110. The outer sidewall 19 of the wall 14, however, may have a slightly positive slope with respect to the plane of the base.

Figure 15:
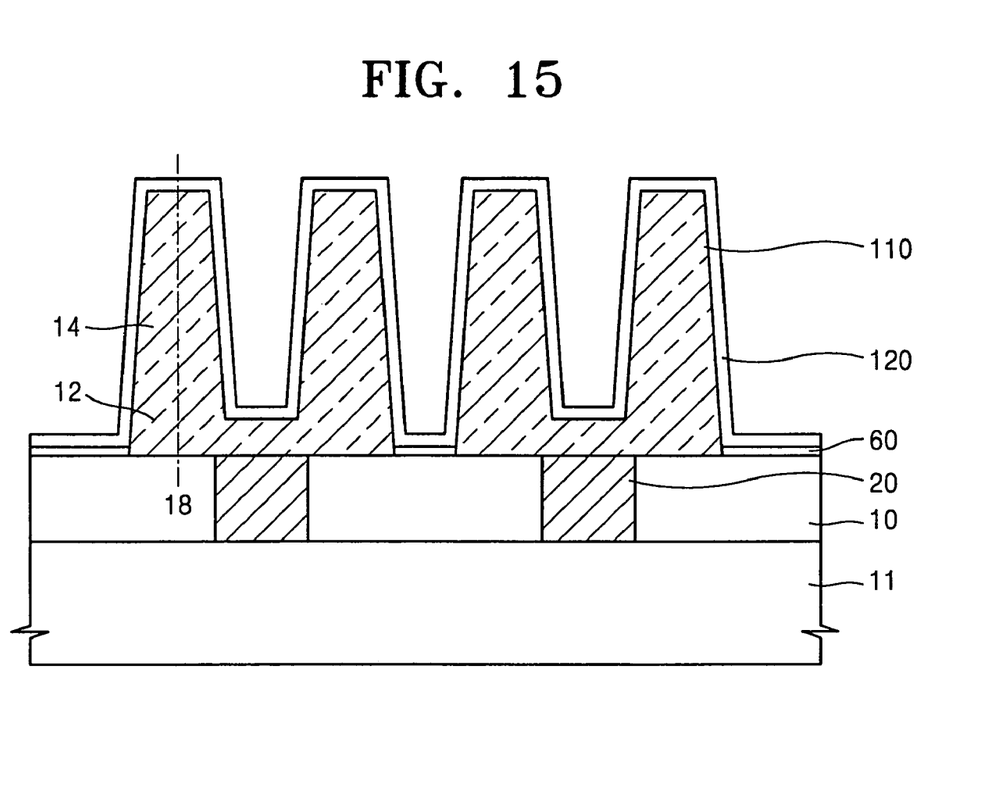
FIG. 15 is a cross-sectional view of a capacitor lower electrode of a semiconductor device according to yet another embodiment of the present invention.

FIG. 15 illustrates an alternative embodiment. Referring to FIG. 15, the wall 14 may be tapered gradually without a step. In other words, the width of the storage node 110 is gradually reduced from the bottom to the top of the wall 14. Although the process illustrated in FIGS. 3–14 are particularly directed to forming a wall that is stepwise tapered, one skilled in the art will understand how to form the wall that is tapered gradually without a step. For example, the structure shown in FIG. 15 can be formed using an etchant that can perform both the vertical and horizontal etching concurrently. The etch selectivity ratio can be chosen to perform both the horizontal and vertical etching processes.

In either embodiment, the base 12 and the wall 14 preferably form a storage node of one cylinder stack (OCS) capacitor. The storage node or the wall 14 may be substantially square, circle, or oval in shape when viewed in plan view.

In conclusion, according to various embodiments of the present invention, minimum space CD can be more easily controlled compared with the conventional capacitor structure. Also, the bottom portion of the storage node 110 is wider than the top portion of the storage node 110 or the bottom portion of the conventional storage node. Further, because the angle between the outer sidewalls 19 and the top surface of the storage node 110 or the plane 13 of the base 12 can be made closer to 90° than that of the prior art structure, the distance between the storage nodes 110 can increased.

For these reasons, the stability of the capacitor structure can be substantially increased, thereby decreasing the conventional problems such as a stiction or leaning phenomenon. And the minimum space CD can be further reduced to, for example, less than about 40 nm as compared with about 60 nm of the conventional storage node structure.

Thus, the reliability of the semiconductor capacitor structure can be improved and the throughput can be increased. Also, further scaling down of semiconductor devices can be facilitated with the principles of the present invention.

While the principles of the present invention have been shown and described with reference to the particular embodiments described herein, it will be understood by those skilled in the art that various changes in form and detail may be made thereto without departing from the spirit and scope of the invention, as covered by the following claims.

The invention claimed is:

1. A method for forming a semiconductor device, the method comprising:
   forming an interlayer insulating layer on a semiconductor substrate, the interlayer insulating layer having a conductive pad therein;
   forming an etch stop layer on the interlayer insulating layer;
   forming a first sacrificial layer on the etch stop layer;
   forming a storage node opening in the first sacrificial layer;
   depositing a conductive layer on the first sacrificial layer and on the sidewalls and the bottom of the opening;
   forming a second sacrificial layer on the conductive layer;
   planarizing the resulting stucture until the top surface of the first sacrificial layer is exposed;
   partially removing an upper portion of the first and second sacrificial layers to expose a sidewall portion of the conductive layer;
   thinning the exposed sidewall portion; and
   removing the remaining portion of the first and second sacrificial layers.

2. The method of claim 1, wherein partially removing an upper portion and thinning the exposed sidewall portion are repeated one or more times.

3. The method of claim 1, wherein partially removing an upper portion of the first and second sacrificial layers comprises chemical dry etching.

4. The method of claim 3, wherein an etch selectivity ratio for the first and second sacrificial layers and the conductive layer is approximately 1000:1.

5. The method of claim 3, wherein the chemical dry etching uses a gas phase without a plasma for etching.

6. The method of claim 5, wherein the gas phase comprises a vaporized wet etchant.

7. The method claim 5, wherein the gas phase comprises anhydrous HF vapor plus $H_2O$ (gas).

8. The method of claim 7, wherein Isoprophyl Alcohol (IPA), an alcohol group having $CH_3OH$, or carboxylic acid having $CH_3COOH$ is used as a catalyst.

9. The method of claim 8, wherein a temperature of the substrate is approximately 0~60° C.; flow rate of anhydrous HF is approximately 100~2000 sccm/sec; and a flow rate of IPA is approximately 50~200 sccm/sec.

10. The method of claim 1, wherein partially removing an upper portion of the first end second sacrificial layers comprises wet etching.

11. The method of claim 10, wherein the wet etching comprises using BOE.

12. The method of claim 1, wherein thinning comprises chemical dry etching.

13. The method of claim 12, wherein the chemical dry etching uses a gas phase comprising $CF_4+O_2$.

14. The method of claim 13, wherein the temperature of the substrate is approximately 0~60° C.; a power is approximately 100 W~600 W; a pressure is approximately 10~50 Pa; a flow rate of $CF_4$ is approximately 30~80 sccm/sec; and a flow rate of $O_2$ is approximately 150~300 sccm/sec.

15. The method of claim 1, wherein thinning comprises wet etching.

16. The method of claim 15, wherein the wet etching comprising using SC1.

17. The method of claim 1, wherein thinning comprises currently etching the sidewall on both sides thereof.

18. The method of claim 1, wherein thinning comprises forming a first and second step on an inner and outer side sidewall of the exposed sidewall portion, respectively, and wherein the first and second steps are substantially symmetrical.

19. The method of claim 1, wherein on etch selectivity ratio for the conductive layer and the first and second sacrificial layers during the thinning is greater than equal to approximately 10:1.

20. The method of claim 1, futher comprising
   forming a dielectric layer over the conductive layer; and
   forming an upper electrode on the dielectric layer.

21. A method for forming a semiconductor device, the method comprising:
   forming an interlayer insulating layer on a semiconductor substrate, the interlayer insulating layer having a conductive pad therein;
   forming an etch stop layer on the interlayer insulating layer;
   forming a first sacrificial layer on the etch stop layer;
   forming a storage node opening in the first sacrificial layer;
   depositing a conductive layer on the first sacrificial layer and on the sidewalls and the bottom of the opening;
   forming a second sacrificial layer on the conductive layer;
   planarizing the resulting structure until the top surface of the first sacrificial layer is exposed;
   partially removing the first and second sacrificial layers in a vertical direction to expose inner and outer sidewalls of the planarized conductive layer;
   partially removing the inner and outer sidewalls of the partially exposed conductive layer in a horizontal direction; and
   removing the remaining portion of the first and second sacrificial layers.

22. The method of claim 21, wherein the inner and outer sidewalls of the partially exposed conductive layer are both etched to a width of approximately 10~40 angstroms.

23. The method of claim 21, wherein partially removing the first and second sacrificial layers; and partially removing the inner and outer sidewall of the partially exposed conductive layer are performed in situ.

24. The method of claim 21, wherein partially removing comprises using a gas phase comprising anhydrous HF vapor and $H_2O$ gas.

25. The method of claim 21, wherein partially removing comprises using a gas phase comprising $CF_4+O_2$.

26. The method of claim 21, wherein partially removing an upper portion and partially etching the inner and outer sidewalls of the partially exposed conductive layer are repeated one or more times.

27. The method of claim 21, further comprising:
   forming a dielectric layer over the conductive layer; and
   forming an upper electrode on the dielectric layer.

28. A method forming a semiconductor device, the method comprising:
   forming an interlayer insulating layer on a semiconductor substrate, the interlayer insulating layer having a conductive pad therein;
   forming an etch stop layer on the interlayer insulating layer;

forming a first sacrificial layer on the etch stop layer;
forming a first storage node opening in the first sacrificial layer;
depositing a conductive layer on the first sacrificial layer and on the sidewalls and the bottom of the opening;
forming a second sacrificial layer on the conductive layer;
planarizing the resulting structure until the top surface of the first sacrificial layer is exposed to form a storage node;
concurrently performing vertical and horizontal etching on the resulting structure such that a width of the storage node is gradually reduced from a bottom to a top of the storage node; and
removing the remaining portion of the first and second sacrificial layers.

29. The method of claim 28, wherein the storage node is tapered gradually without a step.

30. The method of claim 28, further comprising:
forming a dielectric layer over the storage node; and
forming an upper electrode on the dielectric layer.

* * * * *

UNITED STATES PATENT AND TRADEMARK OFFICE
CERTIFICATE OF CORRECTION

PATENT NO.         : 7,018,892 B2
APPLICATION NO. : 10/835142
DATED              : March 28, 2006
INVENTOR(S)        : Shim et al.

It is certified that error appears in the above-identified patent and that said Letters Patent is hereby corrected as shown below:

Column 7, line 43, please replace "method claim 5," with --method of claim 5,--

Column 7, line 53, please replace "first end second" with --first and second--

Column 8, line 10, please replace "on etch selectivity" with --an etch selectivity--

Signed and Sealed this

Twentieth Day of February, 2007

JON W. DUDAS
*Director of the United States Patent and Trademark Office*